B. S. Stokes.

Making Tempering Crucibles.

No. 2,642. Reissued Jun. 11, 1867.

Plan, or horizontal view of the top.

Horizontal Section on the line A. B.

Elevation.

Vertical Section on the line C. D.

Witnesses:
John A. Willis
B. F. Lilley

Inventor:
Benjamin S. Stokes

UNITED STATES PATENT OFFICE

BENJAMIN S. STOKES, OF MANCHESTER, NEW HAMPSHIRE.

IMPROVEMENT IN CRUCIBLES FOR METALLIC BATHS.

Specification forming part of Letters Patent No. 49,009, dated July 25, 1865; Reissue No. 2,642, dated June 11, 1867.

*To all whom it may concern:*

Be it known that I, BENJAMIN S. STOKES, of Manchester, in the county of Hillsborough and State of New Hampshire, have invented an Improved Crucible for Metallic Baths, of which the following is a full, clear, and exact description, reference being had to the accompanying drawings, making part of this specification.

In the employment of baths of melted lead in the process of tempering files and other articles, as usually practiced, for the purpose of heating such articles evenly and uniformly, the crucibles containing the lead are made of cast-iron, and soon deteriorate under the heat to which their outer surfaces are subjected in the furnace and burn through or become porous, and prove insufficient to retain the lead, which percolates through the pores, and is wasted. Such a crucible, after being used about ten days, will often waste from six to twelve pounds of lead per day. For this reason, and although such crucibles do not materially diminish in size or become otherwise impaired, they soon become worthless as baths; and the object of my invention is to remedy this defect by so constructing the crucible that its outer surface shall be shielded from the immediate contact of the heat, air, and volatile products of combustion from the furnace. For this purpose I surround the crucible or lead-containing vessel in whole or in part with a metal jacket or surface-protector, and it is in such construction that my invention primarily consists.

Figure 1:
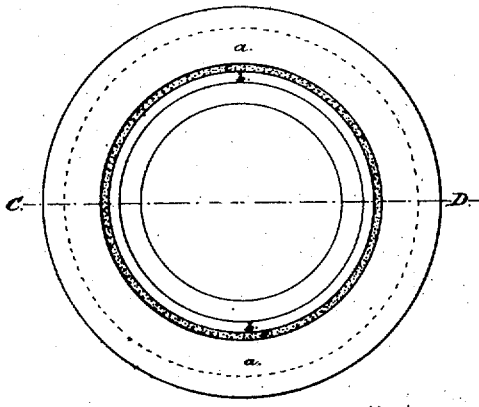
Figure 3:
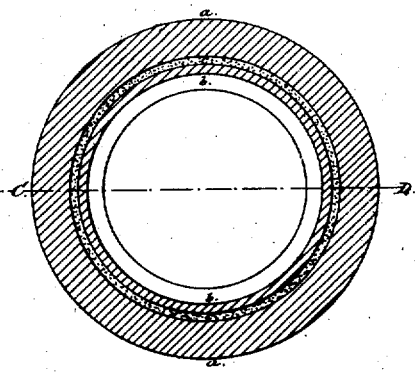
Figure 2:
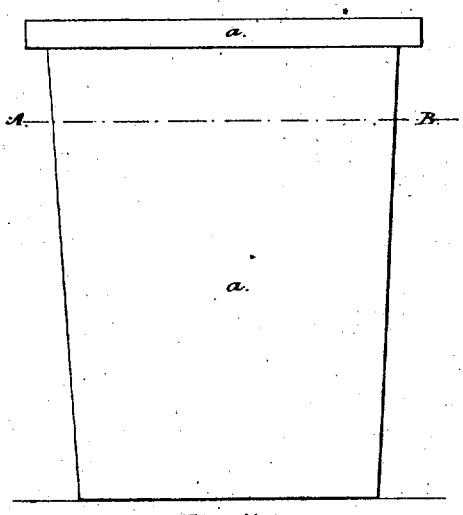
Figure 4:
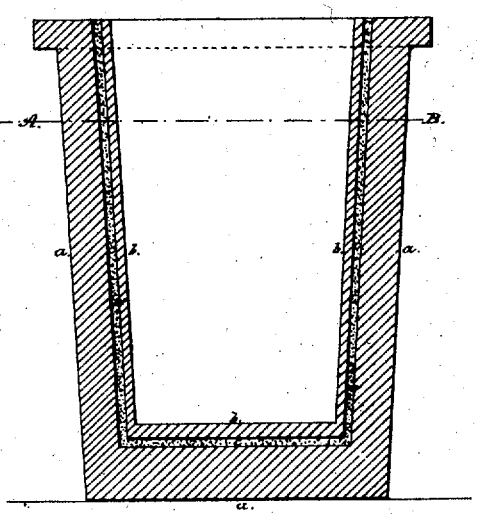

The drawings represent a crucible embodying the invention, Figure 1 showing a plan, Fig. 2 an elevation, Fig. 3 a horizontal section, and Fig. 4 a vertical central section, of the same.

*b* denotes the metal crucible or lead-containing vessel, placed within or surrounded by a metal covering or outer vessel, *a*, this outer vessel or covering being formed of wrought-iron or of cast-iron, as may be desirable, and being preferably made to surround the sides and bottom of the inner crucible, although for many purposes it may not be necessary to more than partially so cover the inner vessel.

For greater protection the outer vessel may be made sufficiently larger than the inner one, to leave a space, *c*, between them, which space may be filled with fine sand. The crucible so made is filled with lead, and is heated in the ordinary manner.

I use this crucible not only in the manufacture of files, which are placed in the lead bath after it is heated to the desired temperature, but for all kinds of cutlery and other steel instruments which are tempered by heating in lead-baths, and my invention applies to all lead or other metal baths, and to all other kinds of crucibles for whatever purposes they may be used.

I prefer to make the inner vessel of wrought-iron on account of its structure and compactness and its tendency to resist leakage from expansion by heat when it is protected from the air; and to protect it from atmospheric air on its outer surface the sand may be introduced as described, my experience proving that this will effectually prevent the outer surface of *b* from oxidation, or from scaling and wearing away.

Another advantage of the sand is that when crucibles *a* and *b* are made of cast and wrought iron the sand will adapt itself to the different degrees of expansion to which such parts are subjected, and will thus relieve any strain that would otherwise result to either *a* or *b*.

I do not wish to confine myself to making *a* of cast-iron, nor to making a space between the crucibles, nor to filling the space with sand, for I contemplate that other materials may be used in their stead to prevent the oxidation and wearing off of the outer surface of the inner crucible, substantially as described, and that such are included in my invention. The inside surface of *b* is always protected from the air by its metallic bath—a fact common to all crucibles.

I claim—

1. A crucible having its outer surface protected in whole or in part by a metal jacket or covering, or the equivalent thereof, substantially as set forth.

2. Combining with an inner and an outer crucible a space or chamber between them filled with sand or equivalent material, substantially as described.

BENJAMIN S. STOKES.

Witnesses:

J. B. CROSBY,

FRANCIS GOULD.